United States Patent [19]

Ichiyoshi

[11] Patent Number: 4,654,864
[45] Date of Patent: Mar. 31, 1987

[54] PHASE SYNCHRONIZING CIRCUIT
[75] Inventor: Osamu Ichiyoshi, Tokyo, Japan
[73] Assignee: NEC Corporation, Tokyo, Japan
[21] Appl. No.: 486,576
[22] Filed: Apr. 19, 1983
[30] Foreign Application Priority Data Apr. 20, 1982 [JP] Japan .................................. 57-64623

[51] Int. Cl.$^4$ ............................................. H03D 3/24
[52] U.S. Cl. .................................... 375/120; 375/81; 328/155; 307/511
[58] Field of Search .......................... 375/81, 82, 120; 331/1 R, 1 A, 11, 12; 328/133, 141, 155; 307/511; 329/50, 122

[56] References Cited

U.S. PATENT DOCUMENTS

| | | | |
|---|---|---|---|
| 3,820,034 | 6/1974 | Ball | 331/12 |
| 3,883,806 | 5/1975 | DeLong et al. | 375/120 |
| 3,906,376 | 9/1975 | Bass | 375/81 |
| 4,017,803 | 4/1977 | Baker | 375/81 |
| 4,085,288 | 4/1978 | Viswanathan | 375/120 |
| 4,347,483 | 8/1982 | Flasza et al. | 331/12 |
| 4,387,342 | 6/1983 | Grosjean | 375/120 |
| 4,419,760 | 12/1983 | Bjornholt | 375/120 |

Primary Examiner—Robert L. Griffin
Assistant Examiner—Stephen Chin
Attorney, Agent, or Firm—Sughrue, Mion, Zinn, Macpeak & Seas

[57] ABSTRACT

A fast pull-in phase synchronizing circuit, including a phaselock loop, having an extended pull-in range. The phase synchronizing circuit includes, besides a conventional phaselock loop, at least a $\pi/2+n\pi$ (n being an integer) phase shifter, a mixer, a low pass filter and another mixer. The phase shifter receives the output of the phaselock loop VCO, the output of the phase shifter being multiplied in the mixer with the circuit input signal. This multiplied signal is applied as an input to the low pass filter, which produces a low frequency output proportional to the frequency difference between the input and output signals. This low frequency signal is mixed in the other mixer with the circuit input signal to produce the phaselock loop input signal. The phaselock loop input is phase compared with the VCO output in the phaseback loop phase comparator. This phase comparator output has by reason of the phase synchronizing circuit of the invention two components, one representing the frequency discrimination characteristic of the circuit, the other the phase comparison characteristic. When in its unsynchronized state, the circuit of the invention operates as an automatic frequency control circuit causing the VCO oscillating frequency to vary in a direction to decrease the frequency error, $W_{in}-W_{out}$. Once the frequency error has been reduced to the pull-in range, i.e. the synchronized range, the circuit of the invention operates to produce phase synchronization.

6 Claims, 6 Drawing Figures

PHASE SYNCHRONIZING CIRCUIT

BACKGROUND OF THE INVENTION

The present invention relates to a phase synchronizing circuit including a phaselock loop for use in communication systems.

Phaselock loops find extensive applications in, for example, synchronizing circuits, frequency demodulators, PSK demodulators, frequency synthesizers, etc. In a prior art basic phaselock loop, a phase comparator compares the phase of an input signal with that of an output signal and a loop filter smoothes the comparison output from the comparator to control a voltage controlled oscillator (VCO) whose output constitutes the output signal mentioned above. However, only a limited range of pull-in frequencies is available with the prior art basic phaselock loop. Should the initial frequency error (the difference frequency between the input and output signals) be outside the pull-in frequency range, it would be impossible to establish phase synchronization. Such a basic phaselock loop, therefore, must often be aided by additional pull-in means as typified by frequency sweep. Furthermore, difficulty has been experienced in adopting the phaselock loop into, for example, a PSK demodulator in a time division multiplex access (TDMA) communication system where fast pull-in is required for a burst operation.

SUMMARY OF THE INVENTION

It is an object of the present invention to provide a synchronizing circuit which has an extended pull-in range and fast pull-in operation.

In accordance with the teachings of the present invention, a phase synchronizing circuit is provided which has a voltage controlled oscillator for generating an output signal in response to a control voltage, a phase comparator for phase-comparing the output signal from the voltage controlled oscillator with a first signal to provide a second signal, and a loop filter for smoothing the second signal to provide the control voltage. A phase shifter phase-shifts the output signal by $(\pi/2)+n\pi$ (n being an integer) to provide a third signal. The first mixer is for mixing the third signal with an input signal to provide a fourth signal. A low-pass filter selects a low frequency component out of the fourth signal and provides a fifth signal whose phase is delayed an amount corresponding to the frequency difference between the input and output signals. A second mixer is for mixing the fifth signal with the input signal to provide the first signal.

DESCRIPTION OF THE PREFERRED EMBODIMENTS

To facilitate understanding of the present invention, a brief reference will be made to a prior art basic phaselock loop, depicted in FIG. 1. As shown, the basic phaselock loop 100 comprises a voltage controlled oscillator (VCO)[1] a phase comparator 2 and a loop filter 3. The phase comparator 2 comprises a mixer or multiplier as is often the case. The loop filter 3, on the other hand, comprises a low-pass filter. The phase comparator 2 compares the frequency and phase of an input signal $V_i(t)$ with those of the output signal $V_o(t)$ from the VCO 1, and generates an average d.c. voltage which is proportional to the difference or error therebetween. The error voltage passed through the loop filter 3 is applied to a control terminal of the VCO 1, whereby the frequency of the VCO 1 is varied in a direction that will reduce the difference in frequency and phase between the input signal $V_i(t)$ and the output signal $V_o(t)$. Should the input signal $V_i(t)$ entering the phase comparator 2 have a frequency which is sufficiently close to the free oscillation frequency $f_0$ of the VCO 1, it would pull in the output of the VCO 1. For further details of a phaselock loop, reference is made to F. M. Gardner "Phaselock Techniques", John Wiley & Sons, and other books. Thus, the basic phaselock loop is limited in the available pull-in frequency range.

Figure 1:
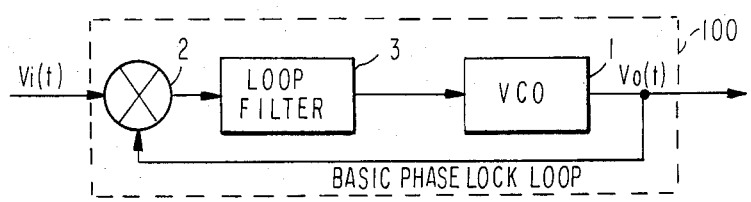
FIG. 1 is a block diagram of a conventional basic phaselock loop.
Figure 2:
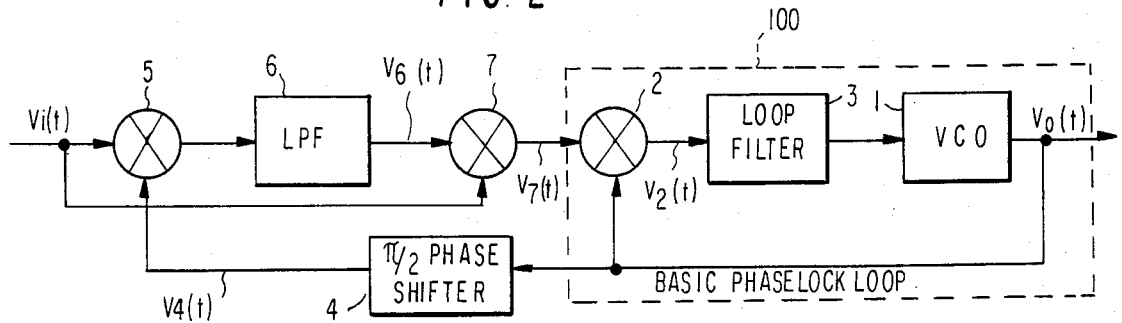
FIG. 2 is a block diagram showing a first embodiment of the phase synchronizing circuit in accordance with the present invention.

Referring to FIG. 2, the general construction of the phase synchronizing circuit in accordance with the present invention is illustrated, in which the same reference numerals as those of FIG. 1 designate the same circuit components. The phase synchronizing circuit comprises a $\pi/2$ phase shifter 4, a mixer or multiplier 5, a low-pass filter (LPF) 6 and a second mixer or multiplier 7, in addition to the basic phaselock loop 100 (FIG. 1).

The operating principle of the circuit shown in FIG. 2 will be described.

The input signal $V_i(t)$ to the loop and the output signal $V_o(t)$ from the loop are respectively assumed to be:

$$V_i(t) = \cos(\omega_i t + \theta_i) \quad \text{Eq. (1)}$$

$$V_o(t) = \sin(\omega_o t + \theta_o) \quad \text{Eq. (2)}$$

where $\omega_i$ and $\theta_i$ are the angular frequency and phase of the input signal respectively, and $\omega_o$ and $\theta_o$ are the oscillation angular frequency and phase of the VCO 1 under zero input condition respectively. Then, the output $V_4(t)$ of the $\pi/2$ phase shifter 4 is produced by:

$$V_4(t) = \sin\left(\omega_o t + \theta_o - \frac{\pi}{2}\right) = -\cos(\omega_o t + \theta_o) \quad \text{Eq. (3)}$$

The low-pass filter 6 passes only a low frequency component therethrough out of the output of the mixer 5. The output $V_6(t)$ of the LPF 6 is expressed as:

$$V_6(t) = \frac{-1}{\sqrt{1 + (\omega_e T_6)^2}} \cos(\omega_e t + \theta_o - \phi) \quad \text{Eq. (4)}$$

where $\omega_e=\omega_i-\omega_o$, $\theta_e=\theta_i-\theta_o$ and $\phi=\tan^{-1}\omega_e T_6$ ($T_6$ being the time constant of the LPF 6).

The output $V_7(t)$ of the mixer 7 is obtained as:

$$V_7(t) = \frac{-1}{\sqrt{1+(\omega_e T_6)^2}} \cos\{(\omega_i+\omega_e)t+(\theta_i+\theta_e)-\phi\} + \cos\{(\omega_i-\omega_e)t+(\theta_i-\theta_e)+\phi\} \quad \text{Eq. (5)}$$

The phase comparator 2 multiplies or mixes the voltage $V_7(t)$ by the voltage $V_o(t)$, generating an output $V_2(t)$:

$$V_2(t) = \frac{1}{\sqrt{1+(\omega_e T_6)^2}}\{\sin(2\omega_e t + 2\theta_e - \phi) + \sin\phi\} \quad \text{Eq. (6)}$$

$$= \frac{1}{\sqrt{1+(\omega_e T_6)^2}}\sin(2\omega_e t + 2\theta_e - \phi) + \frac{\omega_e T_6}{1+(\omega_e T_6)^2}$$

In the Eq. (6), the sum frequency items ($2\omega_i$ and $2\omega_j$) are assumed to be removed by the loop filter 3 and, therefore, are neglected.

It should be noted that in the above equations the outputs $V_5(t)$, $V_7(t)$ and $V_2(t)$ of the multipliers 5 and 7 and loop filter 2 are expressed each in doubled magnitude. This gives rise to no problem because amplitude is of less account than frequency or phase as far as a phaselock loop is concerned.

In the Eq. (6), the second item represents the frequency discrimination characteristic. So long as the absolute value $|\omega_e|$ is sufficiently large relative to the frequency bandwidth of the loop filter 3, i.e., in the unsynchronized state, the first item is suppressed and only the second item is allowed to pass through the loop filter 3 to control the oscillation frequency of the VCO 1, thereby reducing the absolute value $|\omega_e|$. Once the absolute value $|\omega_e|$ enters the synchronizing range, synchronization is rapidly achieved setting up the equation $\omega_e=0$.

Then, the Eq. (6) is rewritten as:

$$V_2(t) = \sin 2\theta_e \approx 2\theta_e \quad \text{Eq. (7)}$$

Under this condition, the phase comparator 2 causes the loop to assume the phase synchronizing control state. In this manner, the phaselock loop of the present invention functions as an automatic frequency control (AFC) circuit in the unsynchronized state thereby reducing the frequency error, while functioning as a phase synchronizing circuit once the frequency error enters the synchronizing range.

Figures 3A, 3B:
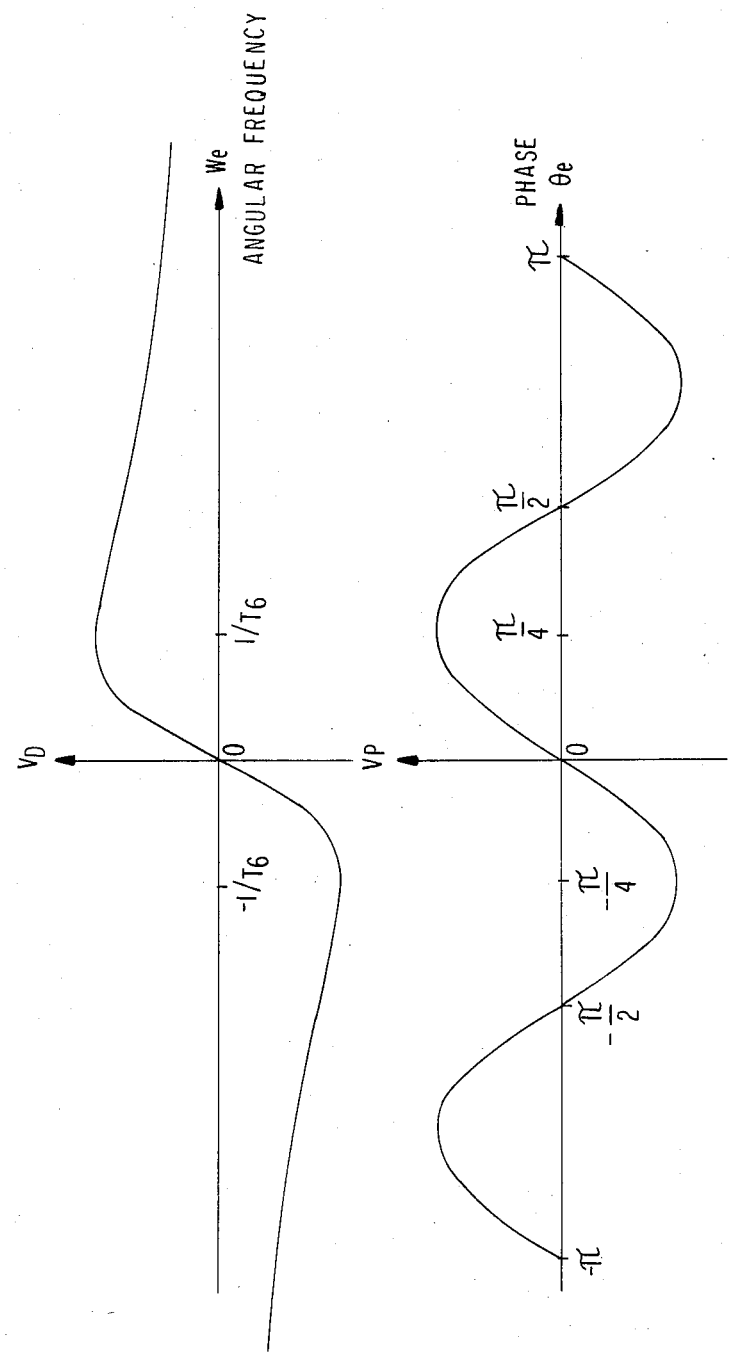
FIG. 3(a) is a plot representing the frequency discrimination characteristic of the phase synchronizing circuit shown in FIG. 2.
FIG. 3(b) is a plot representing the phase comparison characteristic of the phase synchronizing circuit of FIG. 2.

The frequency discrimination characteristic ($V_D=\omega_e T_6/(1+(\omega_e T_6)^2)$) is shown in FIG. 3(a) and the phase comparison characteristic ($V_p=\sin 2\theta_e$), in FIG. 3(b). It will be seen from FIGS. 3(a) and 3(b) that both the frequency discrimination and phase comparison characteristics are of the same polarity when $\theta_e\approx 0$, so that a signal can be stably pulled in and phase-locked.

While the phase shifter has been shown and described as comprising a $\pi/2$ phase shifter, it will be apparent to those skilled in this art that use may be made of a phase shifter which generally shifts the phase by $(\pi/2)+n\pi$ (n being an integer).

Figure 4:
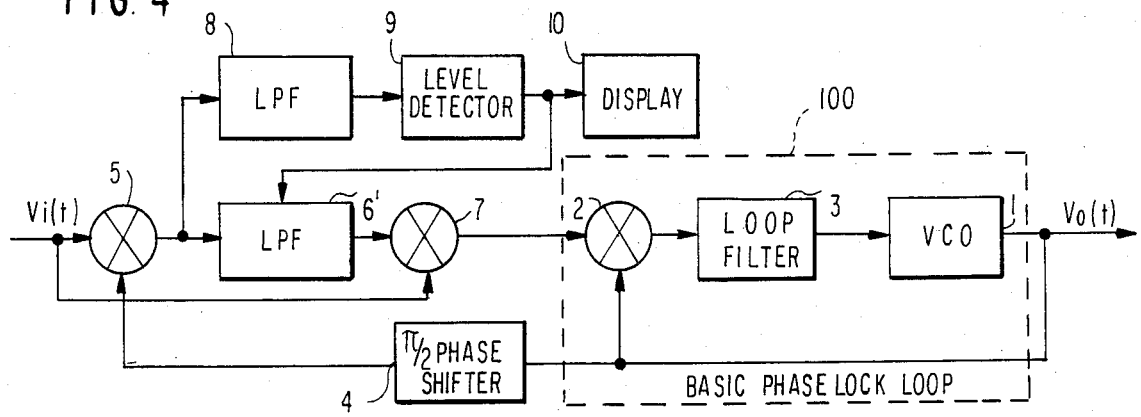
FIG. 4 is a block diagram showing a second embodiment of the phase synchronizing circuit of the present invention.

Referring to FIG. 4, a practical construction of the phase synchronizing circuit of the present invention is shown in which circuit components identical in function with those of FIG. 2 are designated by the same reference numerals.

In comparison with the circuit of FIG. 1, phase synchronizing circuit of FIG. 4 further includes a low-pass filter 6' having a variable time constant, a low-pass filter 8, a level detector (for example, a voltage comparator) 9, and a display 10 such as a light emitting diode. The low-pass filter 8 has a band which is narrow enough to suppress input noise. The detector 9 detects an output of the low-pass filter 8 with respect to a predetermined reference level. In this construction, the detector 9, when the phaselock loop is being synchronized, causes the display 10 to indicate the synchronized state. Simultaneously, the detector 9 increases the time constant of the low-pass filter 6'. On the other hand, the detector 9, in response to asynchronization of the phaselock loop, reduces the time constant. This switchover of the time constant ensures a wider frequency control range in the unsynchronized state while suppressing the deterioration of the S/N ratio at the multiplier 7 in the synchronized state.

Figure 5:
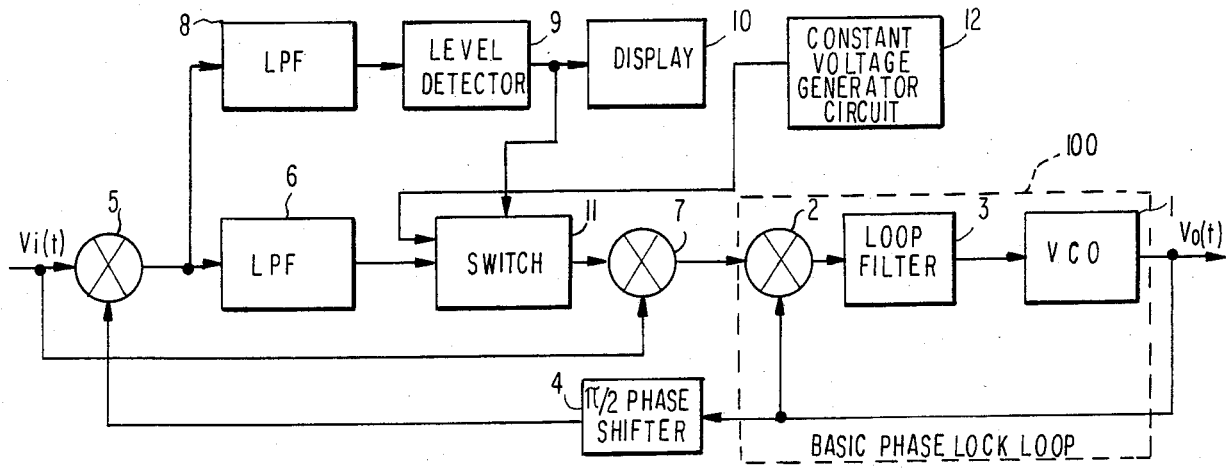
FIG. 5 is a block diagram showing a third embodiment of the phase synchronizing circuit of the present invention.

Another practical arrangement of the phase synchronizing circuit of the present invention is shown in FIG. 5, in which the same reference numerals as those of FIG. 2 or 4 designate the elements common in function. The phase synchronizing circuit of FIG. 5, in comparison with the one of FIG. 1, includes a switch 11, a constant voltage generator circuit 12, the low-pass filter 8, the level detector 9 and the display 10. The detector 9, upon synchronization, actuates the switch 11 to supply the output voltage of the generator circuit 12 to the mixer 7 and to block the output of the filter 6. Because the output of the low-pass filter 6 is blocked in the above condition reducing the multiplier 7 to a simple pass element, the same operation as in the prior art phaselock loop shown in FIG. 1 normally occurs. The mixer 7, therefore, becomes entirely free from the S/N ratio deterioration. On the other hand, the detector 9, upon asynchronization, activates the switch 11 to pass the output of the filter 6 and to block the output of the generator circuit 12. The same operation as the one of FIG. 2 occurs under the asynchronization state.

In summary, it will be seen that the present invention overcomes the problem observed in the prior art phaselock loop in the event of pull-in. That is, even when the initial frequency error lies outside the pull-in frequency range of a phaselock loop, the present invention can serve as a frequency control circuit due to its phase discriminating function; phase synchronization is set up as soon as the frequency error is brought into the synchronizing range. The phaselock loop of the present invention is applicable to a PSK demodulator of a TDMA apparatus or the like which has experienced difficulty in adopting the prior art phaselock loop.

What is claimed is:

1. A phase synchronizing circuit having a voltage controlled oscillator for generating an output signal in response to a control voltage, a phase comparator for phase-comparing said output signal with a first signal to provide a second signal and a loop filter for smoothing said second signal to provide said control voltage, comprising:

a phase shifter for phase-shifting said output signal by $(\pi/2)+n\pi$ (n being an integer) to produce a third signal;

a first mixer for mixing said third signal with an input signal to provide a fourth signal;

a low-pass filter for selecting a low frequency component out of said fourth signal and providing a fifth signal whose phase is delayed an amount proportioned to the frequency difference between said input and output signals; and a second mixer for mixing said fifth signal with said input signal to provide said first signal.

2. A phase synchronizing circuit as claimed in claim 1, further comprising first means connected to the output of said first mixer for detecting the synchronization and asynchronization of said phase synchronizing circuit to provide sixth and seventh signals; and second means responsive to said sixth signal for increasing the time constant of said low pass filter and to said seventh signal for decreasing said time constant of said low pass filter.

3. A phase synchronizing circuit as claimed in claim 1, further comprising first means connected to the output of said first mixer for detecting the synchronization and asynchronization of said phase synchronizing circuit to provide said sixth and seventh signals, second means for generating a constant voltage, and third means responsive to the output of said low-pass filter and said sixth and seventh signals for supplying said constant voltage to said second mixer and blocking the output of said low-pass filter in response to said sixth signal, and for supplying the output of said low-pass filter to said second mixer and blocking said constant voltage in response to said seventh signal.

4. A phase synchronizing circuit as claimed in claim 2 wherein said low pass filter has a variable time constant and wherein:

said first means comprises another low pass filter means, receiving the output of said first mixer, for producing a signal having a phase proportional to the frequency difference between the input signal and said output signal; said another low pass filter means producing said sixth signal when the said frequency difference is sufficiently small to signify synchronization and producing said seventh signal when said frequency difference is too large to allow pull-in thereby signifying asynchronization; and and second means comprises a level detector.

5. A phase synchronizing circuit as claimed in claim 3 wherein:

said first means comprises another low pass filter means, receiving the output of said first mixer, for producing a signal having a phase proportional to the frequency difference between the input signal and said output signal; said another low pass filter means producing said sixth signal when said frequency difference is sufficiently small to signify synchronization and producing said seventh signal when said frequency difference is too large to allow pull-in thereby signifying asynchronization; and said means for supplying comprises a level detector connected to the output of said another low pass filter and a switch means, connected to the output of said level detector, said switch means assuming a first or second state responsive to the output of said level detector, in said first state said switch means supplying said constant voltage to said second mixer while blocking the output of said low pass filter, in said second state said switch means supplying the output of said low-pass filter to said second mixer while blocking said constant voltage.

6. A phase synchronizing circuit adapted to receive an input signal and having a phaselock loop which includes a voltage controlled oscillator generating an output signal in response to a control voltage, a phase comparator means for comparing said output signal with a first signal to provide a second signal and a loop filter means receiving said second signal and producing at its output said control signal, said phase synchronizing circuit further including:

phase shifter means for phase shifting said output signal by $\pi/2 + n\pi$ (n being an integer);

first mixer means for mixing the input signal with the output of said phase shifter means;

low pass filter means connected to the output of said first mixer means for producing a signal having a phase proportional to the frequency difference between the input signal and said output signal; and second mixer means for mixing the output of said low pass filter means and the input signal to produce said first signal;

said second signal having one component representative of the circuit frequency discrimination characteristic and another component representative of the circuit phase comparison characteristic.

* * * * *